(12) United States Patent
Kim et al.

(10) Patent No.: US 10,734,453 B2
(45) Date of Patent: Aug. 4, 2020

(54) METHOD OF MANUFACTURING A COLOR CONVERSION DISPLAY PANEL AND METHOD OF MANUFACTURING A DISPLAY DEVICE INCLUDING THE SAME

(71) Applicant: SAMSUNG DISPLAY CO., LTD., Yongin-si, Gyeonggi-Do (KR)

(72) Inventors: Jin Won Kim, Suwon-si (KR); Sung Woon Kim, Yongin-si (KR); Song Yi Kim, Suwon-si (KR); Min Ki Nam, Incheon (KR); Kyoung Won Park, Seoul (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 56 days.

(21) Appl. No.: 16/212,285

(22) Filed: Dec. 6, 2018

(65) Prior Publication Data

US 2019/0371864 A1    Dec. 5, 2019

(30) Foreign Application Priority Data

Jun. 4, 2018 (KR) .......................... 10-2018-0064432

(51) Int. Cl.
| | | |
|---|---|---|
| *H01L 27/32* | (2006.01) | |
| *G02F 1/1335* | (2006.01) | |
| *G02F 1/13357* | (2006.01) | |
| *G02F 1/1368* | (2006.01) | |
| *H01L 51/56* | (2006.01) | |
| *H01L 51/52* | (2006.01) | |

(52) U.S. Cl.
CPC .......... *H01L 27/322* (2013.01); *G02F 1/1368* (2013.01); *G02F 1/133512* (2013.01); *G02F 1/133516* (2013.01); *G02F 1/133617* (2013.01); *H01L 27/3272* (2013.01); *H01L 51/5253* (2013.01); *H01L 51/56* (2013.01); *G02F 2001/133614* (2013.01); *H01L 2227/323* (2013.01); *H01L 2251/5369* (2013.01)

(58) Field of Classification Search
CPC ... H01L 27/322; H01L 51/56; H01L 27/3272; H01L 51/5253; H01L 2227/323; H01L 2251/5369; H01L 51/5284; H01L 51/5256; G02F 1/133512; G02F 1/133516; G02F 1/133617; G02F 1/1368; G02F 2001/133614
See application file for complete search history.

(56) References Cited

FOREIGN PATENT DOCUMENTS

| KR | 1020160066221 | 6/2016 |
|---|---|---|
| KR | 1020170072418 | 6/2017 |
| KR | 1020170099026 | 8/2017 |
| KR | 1020170110950 | 10/2017 |

*Primary Examiner* — Bac H Au
(74) *Attorney, Agent, or Firm* — F. Chau & Associates, LLC

(57) ABSTRACT

According to an exemplary embodiment of the present inventive concept, a method of manufacturing a color conversion display panel includes forming a plurality of light blocking members on a substrate to partition a first region, a second region, and a third region. A blue light blocking filter is formed on the substrate of both the first region and the second region. A color conversion layer including quantum dots is formed on the blue light blocking filter. A transmissive layer is formed on the substrate of the third region. Water vapor is supplied to the color conversion layer, and a barrier layer is formed on the color conversion layer and the transmissive layer.

20 Claims, 8 Drawing Sheets

METHOD OF MANUFACTURING A COLOR CONVERSION DISPLAY PANEL AND METHOD OF MANUFACTURING A DISPLAY DEVICE INCLUDING THE SAME

CROSS-REFERENCE TO RELATED APPLICATION

This application claims priority to and the benefit of Korean Patent Application No. 10-2018-0064432 filed in the Korean Intellectual Property Office on Jun. 4, 2018, the entire contents of which are herein incorporated by reference.

TECHNICAL FIELD

The present disclosure relates to a color conversion display panel and, more specifically, to a method of manufacturing a color conversion display panel and a method of manufacturing a display device including the color conversion display panel.

DISCUSSION OF THE RELATED ART

Liquid crystal display panels commonly used in display devices include two electric field generating electrodes, a liquid crystal layer, and a color filter. However, since light loss may occur in the color filter of such a display device, a display device may instead include a color conversion panel including quantum dots in order to realize desired colors.

In addition, a display device includes a light emitting diode that may realize red, green, and blue light. When a color conversion display panel is included, it is possible to provide excellent color reproducibility and luminance by controlling a size and content of quantum dots. However, the light conversion rate of the red color conversion layer and the green color conversion layer may be reduced due to a loss of the quantum dots in the process of exposure, development, and post-baking.

SUMMARY

Exemplary embodiments of the present inventive concept provide for a method of manufacturing a color conversion display panel in which a light conversion rate may be increased, and a method of manufacturing a display device including the color conversion display panel.

According to an exemplary embodiment of the present inventive concept, a method of manufacturing a color conversion display panel includes forming a plurality of light blocking members on a substrate to partition a first region, a second region, and a third region. A blue light blocking filter is formed on the substrate of both the first region and the second region. A color conversion layer including quantum dots is formed on the blue light blocking filter. A transmissive layer is formed on the substrate of the third region. Water vapor is supplied to the color conversion layer, and a barrier layer is formed on both the color conversion layer and the transmissive layer.

According to an exemplary embodiment of the present inventive concept, a method of manufacturing a color conversion display panel includes forming a plurality of light blocking members on a substrate to partition a first region, a second region, and a third region. A blue light blocking filter is formed on the substrate of both the first region and the second region. A color conversion layer including quantum dots is formed on the blue light blocking filter. A transmissive layer is formed on the substrate of the third region. The color conversion layer and the transmissive layer are post-baked. The post-baked color conversion layer and transmissive layer are dipped in water at a temperature between 60° C. to 100° C., and a barrier layer is formed on the color conversion layer and the transmissive layer.

According to an exemplary embodiment of the present inventive concept, a method of manufacturing a display device includes forming a first substrate. A transistor is formed on the first substrate. A first display panel including a pixel electrode is connected to the transistor. A second display panel is formed. The first display panel and the second display panel are bonded together. The second display panel may include forming a plurality of light blocking members on a second substrate to partition a first region, a second region, and a third region. A blue light blocking filter is formed on the second substrate of the first region and the second region. A color conversion layer including quantum dots is formed on the blue light blocking filter. A transmissive layer is formed on the second substrate of the third region. Water vapor is supplied to the color conversion layer. A barrier layer is formed on the color conversion layer and the transmissive layer, and a common electrode is formed on the barrier layer.

According to an exemplary embodiment of the present inventive concept, a method of manufacturing a display device includes forming a transistor on a first substrate. A light emitting diode is formed in the transistor. An encapsulation layer is formed on the light emitting diode. A color conversion display panel is formed.

The color conversion display panel may include forming a plurality of light blocking members on a second substrate to partition a first region, a second region, and a third region. A blue light blocking filter is formed on both the second substrate of the first region and the second region. A color conversion layer including quantum dots is formed on the blue light blocking filter. A transmissive layer is formed on the second substrate of the third region. Water vapor is supplied to the color conversion layer. A barrier layer is formed on both the color conversion layer and the transmissive layer, and a common electrode is formed on the barrier layer.

BRIEF DESCRIPTION OF THE DRAWINGS

The above described and additional features of the present inventive concept will be more readily understood by examination of the detailed description in conjunction with the accompanying figures, in which.

DETAILED DESCRIPTION OF THE EXEMPLARY EMBODIMENTS

Figure 1:
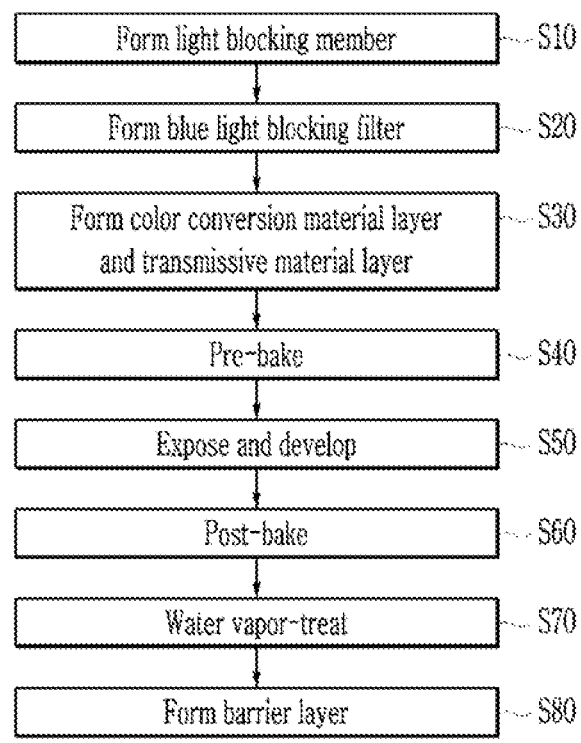
FIG. 1 is a flowchart illustrating a method of manufacturing a color conversion display panel according to an exemplary embodiment of the present inventive concept.

The present inventive concept will be described more fully hereinafter with reference to the accompanying drawings, in which exemplary embodiments of the invention are shown. As those skilled in the art would realize, the described embodiments may be modified in various different ways, all without departing from the spirit or scope of the present disclosure. It will be understood that like reference numerals may designate like elements throughout the specification and figures.

In the drawings, the thicknesses and relative sizes of layers, films, panels, regions, etc. may be exaggerated for clarity. The present disclosure is not necessarily limited to those precise proportions illustrated in the drawings. It will be understood that when an element such as a layer, film, region, or substrate is referred to as being "on" another element, it can be directly on the other element or intervening elements may also be present. Further, in the specification, the word "on" or "above" means positioned on or below the object portion, and does not necessarily mean positioned on the upper side of the object portion based on a gravitational direction.

FIG. 1 is a flowchart illustrating a method of manufacturing a color conversion display panel according to an exemplary embodiment of the present inventive concept. Referring to FIG. 1, a method of manufacturing a color conversion display panel according to the present exemplary embodiment includes forming a light blocking member S10. A blue light blocking filter is formed S20. A color conversion material layer and a transmissive material layer are formed S30. The color conversion material layer and the transmissive material layer are pre-baked S40. The color conversion material layer and the transmissive material layer are exposed and developed to form a color conversion layer and a transmissive layer S50. The color conversion layer and the transmissive layer are post-baked S60. The color conversion layer is water vapor-treated S70, and a barrier layer is formed S80.

In the formation of the light blocking member S10, a plurality of light blocking members are formed on a substrate made of glass, plastic, or a similar material. The plurality of light blocking members are spaced apart from each other at predetermined intervals. The spaces between adjacent light blocking members of the plurality of light blocking members become a first region, a second region, and a third region, respectively. For example, the plurality of light blocking members are spaced apart to partition the first region, the second region, and the third region. The color conversion layer is formed in the first region and the second region. The transmissive layer is formed in the third region. The color conversion layer may itself include a red color conversion layer and a green color conversion layer.

The blue light blocking filter is formed between two light blocking members on the substrate S20. The blue light blocking filter blocks light corresponding to the blue wavelength band and transmits light having other wavelengths. The blue light blocking filter is formed in the first region and the second region, and is not formed in the third region. For example, the blue light blocking filter may be formed in the region where the color conversion layer is later positioned, and is therefore not formed in the region where the transmissive layer is positioned.

Next, in the formation of the color conversion material layer and the transmissive material layer S30, the color conversion material layer is formed on the blue light blocking filter, and the transmissive material layer is formed on the substrate of the third region.

The color conversion material layer includes a red color conversion material layer and a green color conversion material layer. The red color conversion material layer may include a red color conversion material, a photosensitive resin, and a solvent. The green color conversion material layer may include a green color conversion material, a photosensitive resin, and a solvent.

The red color conversion material and the green color conversion material further include quantum dots. The quantum dots may be a Group II-VI compound, a Group III-V compound, a Group IV-VI compound, a Group IV element, and/or a Group IV compound.

The Group II-VI compound may be a two-element compound such as CdSe, CdTe, ZnS, ZnSe, ZnTe, ZnO, HgS, HgSe, HgTe, MgSe, and/or MgS, or a three-element compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and/or MgZnS, or a four-element compound such as HgZnTeS, CdZnSeS, CdZnSeTe, CdZnSTe, CdHgSeS, CdHgSeTe, CdHgSTe, HgZnSeS, HgZnSeTe, and/or HgZnSTe. The Group III-V compound may be a two-element compound such as GaN, GaP, GaAs, GaSb, AlN, AlP, AlAs, AlSb, InN, InP, InAs, and/or InSb, or a three-element compound such as GaNP, GaNAs, GaNSb, GaPAs, GaPSb, AlNP, AlNAs, AlNSb, AlPAs, AlPSb, InNP, InNAs, InNSb, InPAs, and/or InPSb, or a four-element compound such as GaAlNAs, GaAlNSb, GaAlPAs, GaAlPSb, GaInNP, GaInNAs, GaInNSb, GaInPAs, GaInPSb, GaAlNP, InAlNP, InAlNAs, InAlNSb, InAlPAs, and/or InAlPSb. The Group IV-VI compound may be a two-element compound such as SnS, SnSe, SnTe, PbS, PbSe, and/or PbTe, or a three-element compound such as SnSeS, SnSeTe, SnSTe, PbSeS, PbSeTe, PbSTe, SnPbS, SnPbSe, and/or SnPbTe, or a four-element compound such as SnPbSSe, SnPbSeTe, and/or SnPbSTe. The Group IV element may be Si and/or Ge. The Group IV compound may be a two-element compound such as SiC and/or SiGe.

The two-element compound, the three-element compound, or the four-element compound may be present in particles at uniform concentrations, or they may be divided into states having partially different concentrations to be present in the same particle, respectively. In addition, a core/shell structure in which some quantum dots enclose some other quantum dots may be possible. An interface between the core and the shell may have a concentration gradient in which a concentration of elements of the shell decreases closer to its center.

The quantum dots may have a full width at half maximum (FWHM) of the light-emitting wavelength spectrum that is equal to or less than about 45 nm, preferably equal to or less than about 40 nm, and more preferably equal to or less than about 30 nm. In this range, color purity or color reproducibility may be increased. In addition, since light emitted through quantum dots is emitted in all directions, a viewing angle of light may be increased.

A shape of the quantum dots is not particularly limited to a shape traditionally used in the art. For example, quantum dots' shape may be spherical, pyramidal, multi-arm, cubic nanoparticle, nanotube, nano-wire, nano-fiber, and/or nanoplate particle shape, but the invention is not limited thereto.

The transmissive material layer includes a resin that passes blue light, a photosensitive resin, and a solvent.

Each of the red color conversion material layer, the green color conversion material layer, and the transmissive material layer may further include a scatterer. The scatterer may include any material capable of evenly scattering incident light, and may include, for example, one or more of $TiO_2$, $ZrO_2$, $Al_2O_3$, $In_2O_3$, ZnO, $SnO_2$, $Sb_2O_3$, or ITO.

Next, in the pre-baking of the color conversion material layer and the transmissive material layer S40, the color conversion material layer and the transmissive material layer are baked to remove the solvent contained in the color conversion material layer and the transmissive material layer.

Then, in the step for exposing and developing the color conversion material layer and the transmissive material layer to form the color conversion layer and the transmissive layer 50, the pre-baked color conversion material layer and transmissive material layer are exposed by using a mask having a predetermined pattern and then developed to form a patterned color conversion layer and transmissive layer. The color conversion layer includes a red color conversion layer and a green color conversion layer. For example, the red color conversion layer is formed in the first region, the green color conversion layer is formed in the second region, and the transmissive layer is formed in the third region. Thicknesses of the color conversion layer, the transmissive layer, and the light blocking member from the substrate may be the substantially the same.

Next, in the post-baking of the color conversion layer and the transmissive layer S60, the patterned color conversion layer and transmissive layer are post-baked at a temperature of 180° C. or higher for a predetermined length of time. For example, the post-baking process may occur for a duration of 10 minutes or more or 20 minutes or more in order to cure the color conversion layer and the transmissive layer. After positioning the substrate on which the color conversion layer, the transmissive layer, and the light blocking member are formed in a chamber, post-baking may be performed with air or nitrogen ($N_2$) gas at a temperature of 180° C. or higher.

In an exemplary embodiment of the present inventive concept, the processes for manufacturing the color conversion layer and the transmissive layer are sequentially performed. For example, the transmissive layer may be formed first, the red color conversion layer may be formed next, and then the green color conversion layer may be subsequently formed. The transmissive material layer is formed, and then the transmissive material layer is pre-baked. The pre-baked transmissive material layer is exposed and developed to form the transmissive layer, and then the transmissive layer is post-baked. Next, the red color conversion material layer is formed, and then the red color conversion material layer is pre-baked. The pre-baked red color conversion material layer is exposed and developed to form the red color conversion layer, and then the red color conversion layer is post-baked. Subsequently, the green color conversion material layer is formed, and then the green color conversion material layer is pre-baked. The pre-baked green color conversion material layer is exposed and developed to form the green color conversion layer, and then the green color conversion layer is post-baked. However, the order of forming the transmissive layer, the red color conversion layer, and the green color conversion layer is not limited thereto.

Next, in the vapor-treatment of the color conversion layer S70, water vapor is supplied to the red color conversion layer and the green color conversion layer for a predetermined length of time. The step for supplying water vapor may be achieved by first positioning the substrate, on which the color conversion layer, the transmissive layer, and the light blocking member are formed in the chamber before administering the water vapor.

Generally, the light conversion rate of the red color conversion layer and the green color conversion layer is slightly reduced after the steps for exposing and developing S50 and post-baking S60. Reduction of the light conversion rate of the red color conversion layer and the green color conversion layer is caused by loss of the quantum dots in steps for exposing and developing 50 and post-baking S60. However, in the case of the present exemplary embodiment, as the water vapor is supplied to the red color conversion layer and the green color conversion layer for a predetermined length of time, it is possible to increase the light conversion rates of the red and green color conversion layers by compensating for lost quantum dots by supplying water molecules at a high temperature.

Next, a barrier layer is formed to prevent leakage of the water molecules previously supplied to the color conversion layer. In the step to form the barrier layer S80, the barrier layer is formed on the color conversion layer, the transmissive layer, and the light blocking member. Accordingly, the light conversion rate of the color conversion layer may be maintained. Here, the barrier layer may include an inorganic material or an organic material.

Figure 2:
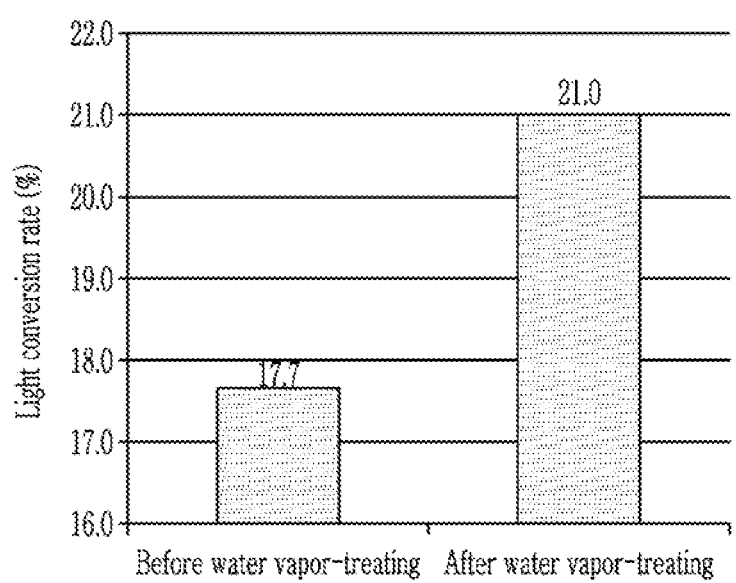
FIG. 2 is a graph illustrating an increased light conversion rate of a color conversion layer formed by the manufacturing method according to FIG. 1.

FIG. 2 illustrates an increased light conversion rate of the color conversion layer formed by the manufacturing method according to FIG. 1.

In FIG. 2, the light conversion rate before and after the supply of the water vapor to the green color conversion layer were compared.

Referring to FIG. 2, the light conversion rate percent before supplying the water vapor to the green conversion layer was 17.7%, and the light conversion rate percent after supplying the water vapor to the green conversion layer was 21.0%. When the water vapor was supplied to the green color conversion layer during the step for water vapor-treat S70, the light conversion rate percent increased by about 19% as compared with the case where the water vapor was not supplied. Therefore, it can be seen that when the conversion layer was subjected a step for water vapor-treat S70, the light conversion rate percent of the color conversion layer was increased.

On the other hand, the post-baking process S60 and the step for supplying water vapor may be simultaneously performed. This will be described with reference to FIG. 3 and FIG. 4.

Figure 3:
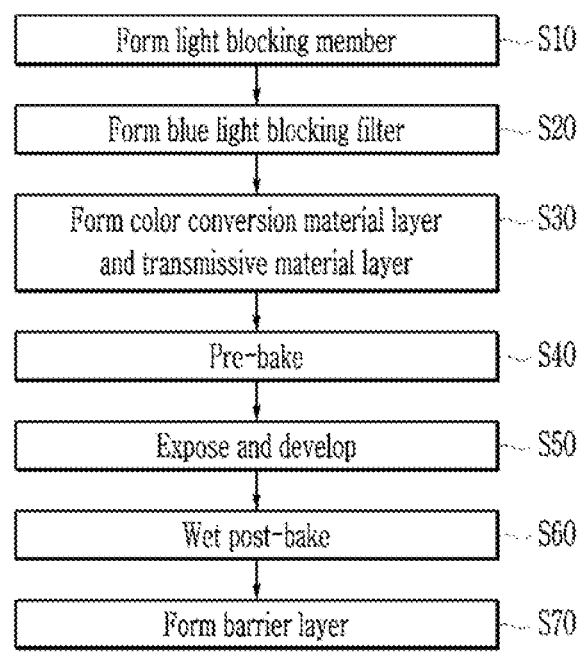
FIG. 3 is a flowchart illustrating a method of manufacturing a color conversion display panel according to an exemplary embodiment of the present inventive concept.

FIG. 3 is a flowchart illustrating a method of manufacturing a color conversion display panel according to an exemplary embodiment of the present inventive concept.

Referring to FIG. 3, a method of manufacturing a color conversion display panel according to the present exemplary embodiment includes forming a light blocking member S10. A blue light blocking filter is formed S20. A color conversion material layer and a transmissive material layer are formed S30. The color conversion material layer and the transmissive material layer are pre-baked S40. The color conversion material layer and the transmissive material layer are exposed and developed to form a color conversion layer and a transmissive layer S50. The color conversion layer and the transmissive layer are wet post-baked S60, and a barrier layer is formed S70.

The method of manufacturing the color conversion display panel according to the present exemplary embodiment differs from the manufacturing method according to FIG. 1 only in that, in the instant embodiment, the post-baking process and the supply of water vapor are simultaneously performed. The remaining processes are the same as in FIG. 1. Omitted details may be assumed to be at least similar to details of corresponding elements already described.

The color conversion layer and the transmissive layer are formed by a series of steps. The light blocking member is formed S10. The blue light blocking filter is formed S20. The color conversion material layer and the transmissive material layer are formed S30. The color conversion material layer and the transmissive material layer are pre-baked S40. The color conversion material layer and the transmissive material layer are exposed and developed of to form the color conversion layer and the transmissive layer S50.

Next, in the wet post-baking of the color conversion layer and the transmissive layer S60, the color conversion layer and the transmissive layer are post-baked at 180° C. or higher for a predetermined length of time. For example, post-baking may occur for 10 minutes or more or 20 minutes or more in order to cure the color conversion layer and the transmissive layer. In this case, the wet post-baking may be performed by using water vapor at 180° C. or higher after positioning the substrate on which the color conversion layer, the transmissive layer, and the light blocking member are formed in a chamber. As such, the color conversion layer and the transmissive layer are cured through the wet post-baking process which involves the introduction of water vapor to the color conversion layer. Therefore, it is possible to increase the light conversion rates of the red and green color conversion layers by compensating for lost quantum dots by supplying water molecules at a high temperature.

Here, a process for manufacturing each of the color conversion layer and the transmissive layer is independently performed. For example, the transmissive layer may be formed first, the red color conversion layer may be formed second, and then the green color conversion layer may be formed last. In this case, the transmissive material layer is formed, and then the transmissive material layer is pre-baked. The pre-baked transmissive material layer is then exposed and developed to form the transmissive layer, and then the transmissive layer is wet post-baked. Next, the red color conversion material layer is formed, and the red color conversion material layer is pre-baked, the pre-baked red color conversion material layer is then exposed and developed to form the red color conversion layer, and then the red color conversion layer is wet post-baked. Next, the green color conversion material layer is formed, and the green color conversion material layer is pre-baked, the pre-baked green color conversion material layer is then exposed and developed to form the green color conversion layer, and then the green color conversion layer is wet post-baked. However, the order of forming the transmissive layer, the red color conversion layer, and the green color conversion layer is not limited thereto.

Next, the barrier layer is formed S70. The barrier layer is formed on the color conversion layer, the transmissive layer, and the light blocking member.

Hereinafter, the light conversion rate of the color conversion layer formed by the manufacturing method according to the present exemplary embodiment will be described with reference to FIG. 4.

Figure 4:
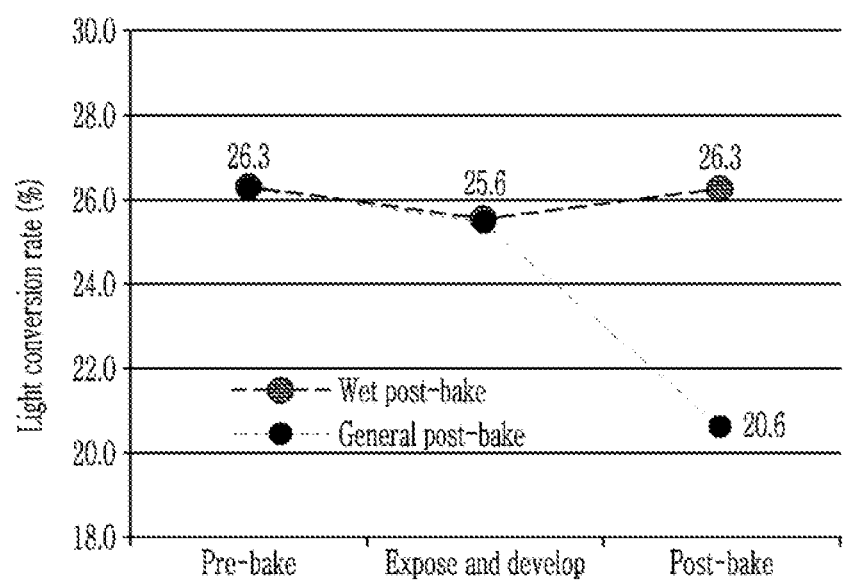
FIG. 4 is a graph illustrating an increased light conversion rate from a color conversion layer formed by the manufacturing method according to FIG. 3.

FIG. 4 illustrates an increased light conversion rate percent of a color conversion layer formed by the manufacturing method according to FIG. 3.

In FIG. 4, the light conversion rate percents were compared between implementation of a wet post-baking process and a general post-baking process without the water vapor.

Referring to FIG. 4, when the wet post-baking process was performed after the green color conversion layer was formed, it can be seen that the light conversion rate percent was increased by about 28% as compared with that of the ordinary post-baking process. Therefore, it can be seen that when the wet post-baking process was performed, as in the manufacturing method according to the present exemplary embodiment, the light conversion rate percent of the color conversion layer increased.

However, the supply of high temperature water molecules to the color conversion layer may be performed by methods other than supplying water vapor. This will be described with reference to FIG. 5 and FIG. 6.

Figure 5:
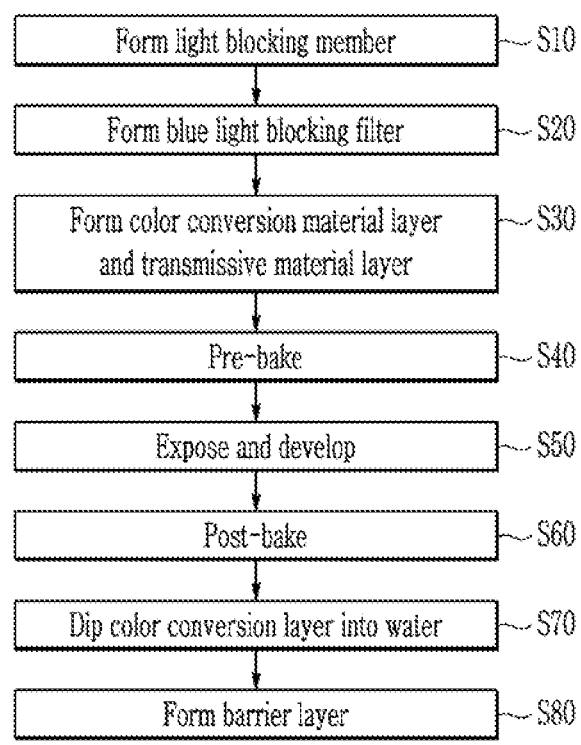
FIG. 5 is a flowchart illustrating a method of manufacturing a color conversion display panel according to an exemplary embodiment of the present inventive concept.

FIG. 5 illustrates a flowchart of a method of manufacturing a color conversion display panel according to an exemplary embodiment of the present inventive concept.

Referring to FIG. 5, a method of manufacturing a color conversion display panel according to the present exemplary embodiment includes forming a light blocking member S10. A blue light blocking filter is formed S20. A color conversion material layer and a transmissive material layer are formed S30. The color conversion material layer and the transmissive material layer are pre-baked S40. The color conversion material layer and the transmissive material layer are exposed and developed to form a color conversion layer and a transmissive layer S50. The color conversion layer and the transmissive layer are post-baked S60. The color conversion layer is dipped into water S70, and a barrier layer is formed S80.

The method of manufacturing the color conversion display panel according to the present exemplary embodiment differs from the manufacturing method according to FIG. 1 only in that the color conversion layer in the instant exemplary embodiment is dipped in water rather than exposed to water vapor. The remaining processes are the same as depicted in FIG. 1. Omitted details may be assumed to be at least similar to details of corresponding elements already described.

The color conversion layer and the transmissive layer are formed and cured through a series of steps. The light blocking member is formed S10. The blue light blocking filter is formed S20. The color conversion material layer and the transmissive material layer are formed S30. The color conversion material layer and the transmissive material layer are pre-baked S40. The color conversion material layer and the transmissive material layer are exposed and developed to form the color conversion layer and the transmissive layer S50, respectively. The color conversion layer and the transmissive layer are post-baked S60.

Next, in the dipping of the color conversion layer into the water S70, the substrate on which the color conversion layer, the transmissive layer, and the light blocking member are formed is dipped into water at a temperature between 60° C. to 100° C. for a predetermined duration of time. Thus, high temperature water molecules may be supplied to the color conversion layer. Therefore, it is possible to increase the light conversion rate percents of the red and green color conversion layers.

Next, the barrier layer is formed S80. The barrier layer is formed on the color conversion layer, the transmissive layer, and the light blocking member.

Hereinafter, the light conversion rate percent of the color conversion layer formed by the manufacturing method according to the present exemplary embodiment will be described with reference to FIG. 6.

Figure 6:
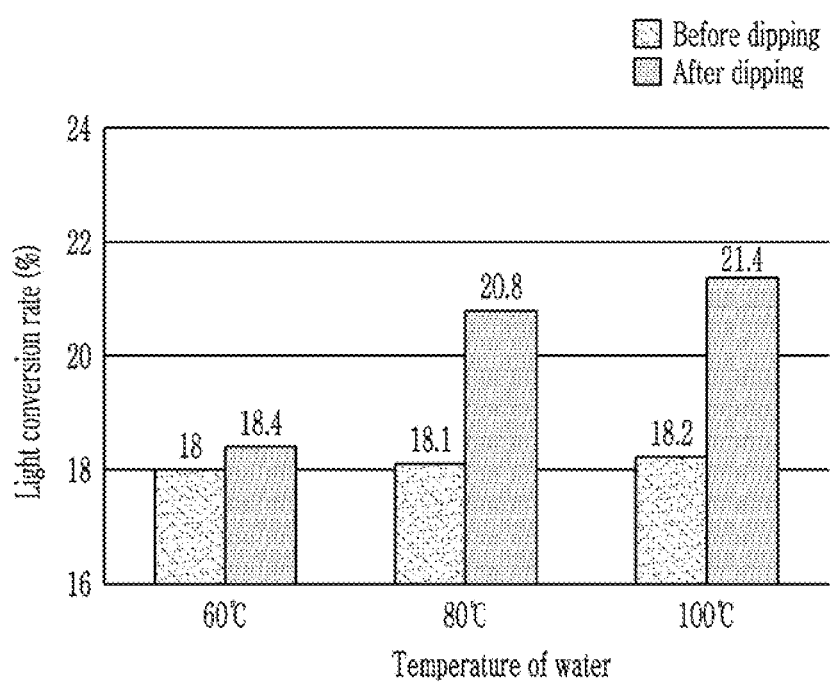
FIG. 6 is a graph illustrating an increased light conversion rate of a color conversion layer formed by the manufacturing method according to FIG. 5.

FIG. 6 illustrates an increased light conversion rate percent of a color conversion layer formed by the manufacturing method according to FIG. 5.

In FIG. 6, after the green color conversion layer was formed, the light conversion rate percents before and after the green color conversion layer was dipped in the water were compared. In this case, the green color conversion layer was dipped into water at temperatures of 60° C., 80° C., and 100° C. for 10 minutes, respectively.

Referring to FIG. 6, when the green color conversion layer was dipped into the water at a temperature of 60° C., it can be seen that the light conversion rate percent was increased by about 2% as compared with that before the green color conversion layer was dipped. In addition, when the green color conversion layer was dipped into the water at a temperature of 80° C., it can be seen that the light conversion rate percent was increased by about 15% as compared with that before the green color conversion layer was dipped. Further, when the green color conversion layer was dipped into the water at a temperature of 100° C., it can be seen that the light conversion rate percent was increased by about 18% as compared with that before the green color conversion layer was dipped. For example, when the green color conversion layer was dipped in the water at a temperature of 60° C., 80° C., or 100° C., the light conversion rate was increased in every case. Moreover, it can be seen that the higher the temperature of the water in which the color conversion layer was dipped, the greater the light conversion rate percent increase.

Although it is described in embodiments of FIG. 2, FIG. 4, and FIG. 6 that the light conversion rate percent of the green color conversion layer is increased, the inventive concepts are not limited thereto, and a light conversion rate percent of a red color conversion layer formed by the manufacturing method according to FIG. 1, FIG. 3, and FIG. 5 may be increased.

The color conversion display panel manufactured by the method described above may be applied to a display. This will be described with reference to FIG. 7 and FIG. 8.

Figure 7:
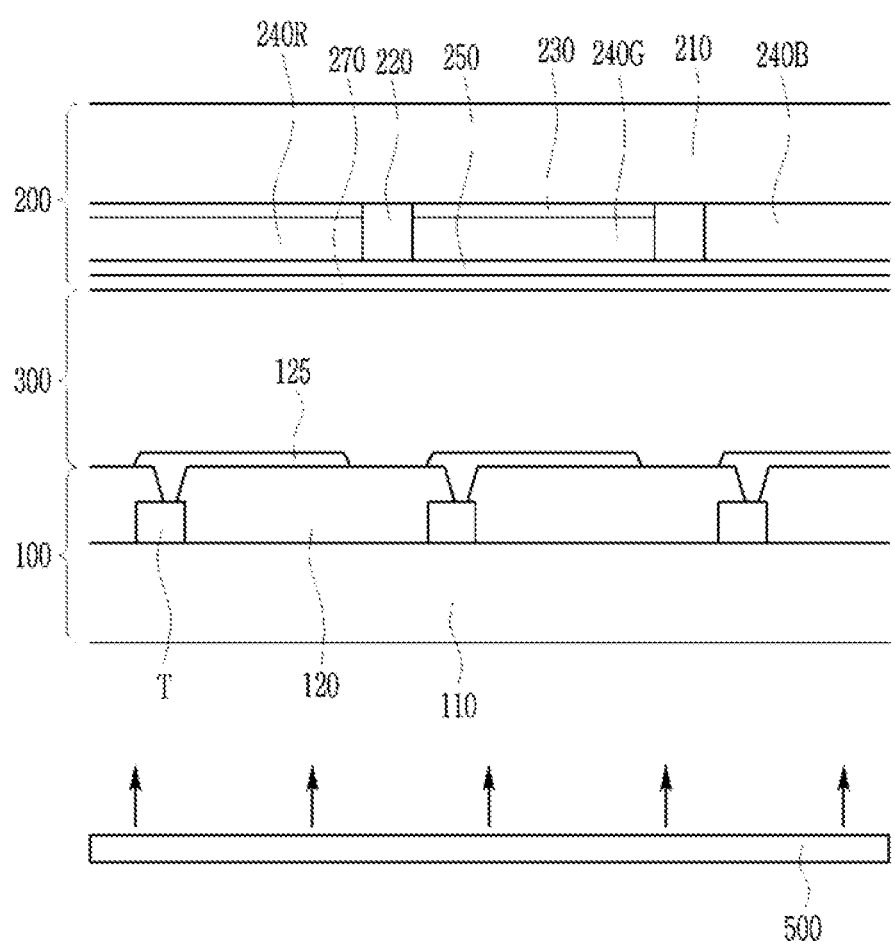
FIG. 7 is a cross-sectional view of a liquid crystal display according to an exemplary embodiment of the present inventive concept.

FIG. 7 illustrates a cross-sectional view of a liquid crystal display according to an exemplary embodiment of the present inventive concept.

Referring to FIG. 7, the liquid crystal display according to the present exemplary embodiment includes a first display panel 100, a second display panel 200, a liquid crystal layer 300, and a light source 500. The liquid crystal layer 300 is disposed between the first display panel 100 and the second display panel 200, and the first display panel 100 is disposed between the liquid crystal layer 300 and the light source 500. For example, the light source 500 emits light and supplies emitted light to the first display panel 100.

The first display panel 100 includes a first substrate 110, a transistor T, an insulating layer 120, and a pixel electrode 125.

The first substrate 110 may have a composition that includes glass or plastic. The transistor T is disposed on the first substrate 110, and the insulating layer 120 is disposed on the transistor T and the first substrate 110. The pixel electrode 125 is disposed on the insulating layer 120, and is connected to the transistor T.

The second display panel 200 includes a second substrate 210, a light blocking member 220, a blue light blocking filter 230, a red color conversion layer 240R, a green color conversion layer 240G, a transmissive layer 240B, a barrier layer 250, and a common electrode 270. The light blocking member 220, the blue light blocking filter 230, and the red color conversion layer 240R are disposed between the second substrate 210 and the first display panel 100. The green color conversion layer 240G, the transmissive layer 240B, the barrier layer 250, and the common electrode 270 are also disposed between the second substrate 210 and the first display panel 100.

The second substrate 210 may include glass or plastic in its composition. The light blocking members 220 are disposed on one surface of the second substrate 210, and are spaced apart from each other at a predetermined distance. The light blocking members 220 may partition regions in which the red color conversion layer 240R, the green color conversion layer 240G, and the transmissive layer 240B are disposed.

The light blocking members 220 may include a material that absorbs incident light, or may include a material that reflects light. For example, when the light blocking member 220 includes a metal material, the light blocking member 220 reflects light incident to the light blocking member 220 from the red color conversion layer 240R, the green color conversion layer 240G, and the transmissive layer 240B, to the red color conversion layer 240R, the green color conversion layer 240G, and the transmissive layer 240B again, thereby increasing light efficiency.

The blue light blocking filter 230 is disposed between the light blocking members 220 on one surface of the second substrate 210. The blue light blocking filter 230 blocks light corresponding to the blue wavelength band and transmits light of other wavelengths. The blue light blocking filter 230 may include any material appropriate for performing the above-described functions.

The red color conversion layer 240R and the green color conversion layer 240G are disposed on one surface of the blue light blocking filter 230 between the light blocking members 220. The transmissive layer 240B is disposed on one surface of the second substrate 210 between the light blocking members 220. For example, the blue light blocking filters 230 are disposed between the red color conversion layer 240R and a surface of the second substrate 210, and between the green color conversion layer 240G and a surface of the second substrate 210.

The red color conversion layer 240R converts blue light supplied from the light source 500 into red light and emits it. The green color conversion layer 240G converts the blue light supplied from the light source 500 into green light and emits it. The transmissive layer 240B emits the blue light supplied from the light source 500 unaltered.

The red color conversion layer 240R and the green color conversion layer 240G include quantum dots. The quantum dots may include a Group II-VI compound, a Group III-V compound, a Group IV-VI compound, a Group IV element, and/or a Group IV compound.

The Group II-VI compound may include a two-element compound such as CdSe, CdTe, ZnS, ZnSe, ZnTe, ZnO, HgS, HgSe, HgTe, MgSe, and/or MgS, or a three-element compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and/or MgZnS, or a four-element compound such as HgZnTeS, CdZnSeS, CdZnSeTe, CdZnSTe, CdHgSeS, CdHgSeTe, CdHgSTe, HgZnSeS, HgZnSeTe, and/or HgZnSTe. The Group III-V compound may be a two-element compound such as GaN, GaP, GaAs, GaSb, AlN, AlP, AlAs, AlSb, InN, InP, InAs, and/or InSb, or a three-element compound such as GaNP, GaNAs, GaNSb, GaPAs, GaPSb, AlNP, AlNAs, AlNSb, AlPAs, AlPSb, InNP, InNAs, InNSb, InPAs, and/or InPSb, or a four-element compound such as GaAlNAs, GaAlNSb, GaAlPAs, GaAlPSb, GaInNP, GaIn-NAs, GaInNSb, GaInPAs, GaInPSb, GaAlNP, InAlNP, InAl-NAs, InAlNSb, InAlPAs, and/or InAlPSb. The Group IV-VI compound may be a two-element compound such as SnS, SnSe, SnTe, PbS, PbSe, and/or PbTe, or a three-element compound such as SnSeS, SnSeTe, SnSTe, PbSeS, PbSeTe, PbSTe, SnPbS, SnPbSe, and/or SnPbTe, or a four-element compound such as SnPbSSe, SnPbSeTe, and/or SnPbSTe. The Group IV element may be Si and/or Ge. The Group IV compound may be a two-element compound such as SiC and/or SiGe.

In this case, the two-element compound, the three-element compound, or the four-element compound may be present in particles at uniform concentrations, or they may be separated into states having partially different concentrations to be present in the same particle. In addition, a core/shell structure in which some quantum dots enclose other quantum dots may be possible. An interface between the core and the shell may have a concentration gradient in which a concentration of elements of the shell decreases closer to its center.

The quantum dots may have a full width at half maximum (FWHM) of the light-emitting wavelength spectrum that is equal to or less than about 45 nm, preferably equal to or less than about 40 nm, and more preferably equal to or less than about 30 nm. In this range color purity or color reproducibility may be increased. In addition, since light emitted through the quantum dots is emitted in all directions, a viewing angle of light may be increased.

Further, a shape of the quantum dots is not particularly limited to a shape customarily used in the art, and may therefore feature a spherical, pyramidal, multi-arm, or cubic nanoparticle, nanotube, nano-wire, nano-fiber, nano-plate particle shape, but is not limited thereto.

The transmissive material layer 240B is composed of a resin capable of passing blue light.

Each of the red color conversion layer 240R, the green color conversion layer 240G, and the transmissive layer 2408 may further include a scatterer. The scatterer may include any material capable of evenly scattering incident light. For example, the scatterer may include one of $TiO_2$, $ZrO_2$, $Al_2O_3$, $In_2O_3$, $ZnO$, $SnO_2$, $Sb_2O_3$, and/or ITO.

The barrier layer 250 is disposed on one surface of each of the red color conversion layer 240R, the green color conversion layer 240G, the transmissive layer 240B, and the light blocking member 220. The barrier layer 250 may serve to prevent high temperature water particles from leaking when supplied to the red color conversion layer 240R and the green color conversion layer 240G in the process of forming the second display panel 200. The barrier layer 250 may include an inorganic material or an organic material.

The common electrode 270 is disposed on one surface of the barrier layer 250.

The second display panel 200 may be formed by forming the common electrode 270 in the color conversion display panel manufactured by the manufacturing method according to FIG. 1, FIG. 3, or FIG. 5 described above.

The liquid crystal display according to FIG. 7 may be formed by forming the first display panel 100, forming the second display panel 200, and then dripping a liquid crystal on to either the first display panel 100 or the second display panel 200, and then bonding the first display panel 100 and the second display panel 200 together. In addition, the liquid crystal display may be formed by forming the first display panel 100, forming the second display panel 200, combining the first display panel 100 and the second display panel 200 together, and then injecting a liquid crystal between the first display panel 100 and the second display panel 200.

Figure 8:
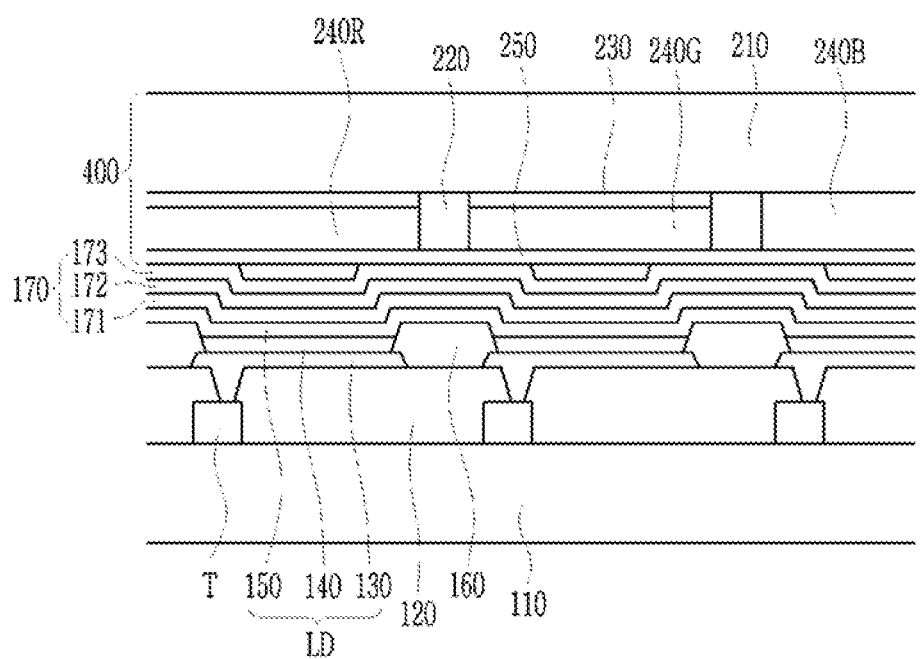
FIG. 8 is a cross-sectional view of a light emitting diode display according to an exemplary embodiment of the present inventive concept.

FIG. 8 illustrates a cross-sectional view of a light emitting diode display according to an exemplary embodiment of the present inventive concept.

Referring to FIG. 8, the light emitting diode display according to the present exemplary embodiment includes the first substrate 110, the transistor T, the insulating layer 120, and a light emitting diode LD. The light emitting diode may further include a pixel defining layer 160, an encapsulation layer 170, and a color conversion display panel 400.

The first substrate 110 is composed of glass or plastic. The transistor T is disposed on the first substrate 110, and the insulating layer 120 is disposed on the transistor T and the first substrate 110. The light emitting diode LD is disposed on the insulating layer 120, and is connected to the transistor T.

The light emitting diode LD includes a first electrode 130 connected to the transistor T, an emission member 140 disposed on the first electrode 130, and a second electrode 150 disposed on the emission member 140. In the present exemplary embodiment, the first electrode 130 may be an anode of the light emitting diode LD, and the second electrode 150 may be a cathode of the light emitting diode LD. The first electrode 130 includes a conductive material on which light is reflected, and the second electrode 150 may include a transparent conductive material such as indium tin oxide (ITO) or indium zinc oxide (IZO). Thus, light emitted from the emission member 140 is emitted toward the second electrode 150. The emission member 140 may emit blue light.

The pixel defining layer 160 is disposed on the insulating layer 120 and the first electrode 130, and is provided with an opening overlapping the first electrode 130. The emission member 140 is disposed on the first electrode 130 in the opening of the pixel defining layer 160, and the second electrode 150 is disposed on the emission member 140.

The encapsulation layer 170 is disposed on the second electrode 150 to protect the light emitting diode LD. The encapsulation layer 170 may include a first inorganic layer 171 disposed on the second electrode 150. An organic layer 172 may be disposed on the first inorganic layer 171. A second inorganic layer 173 may be disposed on the organic layer 172. However, the present invention is not limited thereto, and the encapsulation layer 170 may have a multi-layer structure of four or more layers in which inorganic layers and organic layers are alternately and repeatedly stacked.

The color conversion display panel 400 is disposed on the encapsulation layer 170. The color conversion display panel 400 includes the second substrate 210, the light blocking member 220, the blue light blocking filter 230, the red color conversion layer 240R, and the green color conversion layer 240G. The color conversion display panel 400 may further include a transmissive layer 240B, and a barrier layer 250. The light blocking member 220, the blue light blocking filter 230, and the red color conversion layer 240R are disposed between the second substrate 210 and an encapsulation layer 17. The green color conversion layer 240G, the transmissive layer 240B, and the barrier layer 250 are also disposed between the second substrate 210 and an encapsulation layer 170. The barrier layer 250 is disposed on the encapsulation layer 170. The barrier layer 250 may be bonded to the encapsulation layer 170 by an adhesive layer.

The color conversion display panel 400 may be formed by one of the manufacturing methods described in FIG. 1, FIG. 3, or FIG. 5 above.

The structure of the color conversion display panel 400 according to the present exemplary embodiment is the same as the structure illustrated in the second display panel 200 of the liquid crystal display according to FIG. 7 except that the common electrode 270 is eliminated. Therefore, a detailed description of the color conversion display panel 400 will be omitted. Omitted details may be assumed to be at least similar to details of corresponding elements already described The light emitting diode display according to FIG. 8 may be formed by the following manufacturing method. First, the transistor T is formed on the first substrate 110. The insulating layer 120 is formed on the first substrate 110 and the transistor T, and then the first electrode 130 connected to the transistor T is formed on the insulating layer 120.

Next, the pixel defining layer 160 provided with an opening overlapping the first electrode 130 is formed on the first electrode 130. The emission member 140 is formed on the first electrode 130 in the opening, and then the second electrode 150 is formed on the emission member 140 and the pixel defining layer 160.

Next, the encapsulation layer 170 is formed on the second electrode 150.

After the color conversion display panel 400 is formed by the manufacturing method according to FIG. 1, FIG. 3, or FIG. 5 described above, the color conversion display panel 400 is bonded to the encapsulation layer 170. In this case, the barrier layer 250 of the color conversion display panel 400 and the encapsulation layer 170 may be bonded to each other by an adhesive layer.

While this invention has been described in connection with what is presently considered to be practical exemplary embodiments, it is to be understood that the invention is not limited to the disclosed embodiments, but rather covers various modifications and equivalent arrangements included within the spirit and scope of the appended claims.

What is claimed is:

1. A method of manufacturing a color conversion display panel, comprising:
   forming a plurality of light blocking members that partition a substrate into a first region, a second region, and a third region;
   forming a blue light blocking filter on the substrate of both the first region and the second region;
   forming a color conversion layer including quantum dots on the blue light blocking filter, and forming a transmissive layer on the substrate of the third region;
   supplying water vapor to the color conversion layer; and
   forming a barrier layer on both the color conversion layer and the transmissive layer.

2. The method of manufacturing the color conversion display panel of claim 1, further comprising:
   post-baking the color conversion layer and the transmissive layer before the supplying of water vapor to the color conversion layer.

3. The method of manufacturing the color conversion display panel of claim 2, wherein
   the supplying of water vapor to the color conversion layer is performed by water vapor-treating the color conversion layer.

4. The method of manufacturing the color conversion display panel of claim 1, wherein
   the supplying of water vapor to the color conversion layer includes wet post-baking the color conversion layer and the transmissive layer.

5. The method of manufacturing the color conversion display panel of claim 4, wherein
   the wet post-baking process uses water vapor at a temperature of at least 180° C.

6. The method of manufacturing the color conversion display panel of claim 1, wherein
   the color conversion layer includes a red color conversion layer and a green color conversion layer,
   the red color conversion layer is formed in the first region; and
   the green color conversion layer is formed in the second region.

7. A method of manufacturing a color conversion display panel, comprising:
   forming a plurality of light blocking members partitioning a substrate into a first region, a second region, and a third region;
   forming a blue light blocking filter on both the substrate of the first region and the second region;
   forming a color conversion layer including quantum dots on the blue light blocking filter, and forming a transmissive layer on the substrate of the third region;
   post-baking the color conversion layer and the transmissive layer;
   dipping the post-baked color conversion layer and transmissive layer into water at a temperature between 60° C. to 100° C.; and
   forming a barrier layer on both the color conversion layer and the transmissive layer.

8. The method of manufacturing the color conversion display panel of claim 7, wherein
   the color conversion layer includes a red color conversion layer and a green color conversion layer,
   the red color conversion layer is formed in the first region; and
   the green color conversion layer is formed in the second region.

9. A method of manufacturing a display device, comprising:
   forming a first substrate, forming a transistor on the first substrate, and forming a first display panel including a pixel electrode connected to the transistor;
   forming a second display panel; and
   bonding the first display panel and the second display panel, wherein the forming of the second display panel includes:
      forming a plurality of light blocking members partitioning a second substrate into a first region, a second region, and a third region;
      forming a blue light blocking filter on the second substrate of the first region and the second region;
      forming a color conversion layer including quantum dots on the blue light blocking filter, and forming a transmissive layer on the second substrate of the third region;
      supplying water vapor to the color conversion layer;
      forming a barrier layer on both the color conversion layer and the transmissive layer; and
      forming a common electrode on the barrier layer.

10. The method of manufacturing the display device of claim 9, further comprising:
    post-baking the color conversion layer and the transmissive layer before supplying of water vapor to the color conversion layer.

11. The method of manufacturing the display device of claim 10, wherein
    the supplying of water vapor to the color conversion layer includes water vapor-treating the color conversion layer.

12. The method of manufacturing the display device of claim 9, wherein
the supplying of water vapor to the color conversion layer includes wet post-baking the color conversion layer and the transmissive layer.

13. The method of manufacturing the display device of claim 12, wherein
the wet post-baking uses water vapor at a temperature of at least 180° C.

14. The method of manufacturing the display device of claim 9, wherein
the color conversion layer includes a red color conversion layer and a green color conversion layer;
the red color conversion layer is formed in the first region; and
the green color conversion layer is formed in the second region.

15. A method of manufacturing a display device, comprising:
forming a transistor on a first substrate;
forming a light emitting diode in the transistor;
forming an encapsulation layer on the light emitting diode;
forming a color conversion display panel; and
bonding the color conversion display panel to the encapsulation layer,
wherein the forming of the color conversion display panel includes:
forming a plurality of light blocking members that partition a second substrate into a first region, a second region, and a third region;
forming a blue light blocking filter on the second substrate of the first region and the second region of the second substrate;
forming a color conversion layer including quantum dots on the blue light blocking filter, and forming a transmissive layer on the third region of the second substrate;
supplying water vapor to the color conversion layer;
forming a barrier layer on the color conversion layer and the transmissive layer, and
forming a common electrode on the barrier layer.

16. The method of manufacturing the display device of claim 15, further comprising:
post-baking the color conversion layer and the transmissive layer before supplying water vapor to the color conversion layer.

17. The method of manufacturing the display device of claim 16, wherein
the supplying water vapor to the color conversion layer is performed by water vapor-treating the color conversion layer.

18. The method of manufacturing the display device of claim 15, wherein
the supplying water vapor to the color conversion layer is performed by wet post-baking the color conversion layer and the transmissive layer.

19. The method of manufacturing the display device of claim 18, wherein
the wet post-baking process uses water vapor at a temperature of at least 180° C.

20. The method of manufacturing the display device of claim 15, wherein
the color conversion layer further comprises a red color conversion layer and a green color conversion layer,
the red color conversion layer is formed in the first region; and
the green color conversion layer is formed in the second region.

* * * * *